US009444267B2

(12) United States Patent
Suzuki et al.

(10) Patent No.: US 9,444,267 B2
(45) Date of Patent: Sep. 13, 2016

(54) CELL VOLTAGE EQUALIZER FOR MULTI-CELL BATTERY PACK WHICH DETERMINES THE WAITING TIME BETWEEN EQUALIZATION OPERATIONS BASED ON THE VOLTAGE DIFFERENCE AND THE STATE OF CHARGE LEVEL

(71) Applicant: YAZAKI CORPORATION, Tokyo (JP)

(72) Inventors: Shingo Suzuki, Susono (JP); Tsutomu Saigou, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 406 days.

(21) Appl. No.: 13/796,770

(22) Filed: Mar. 12, 2013

(65) Prior Publication Data
US 2013/0187611 A1    Jul. 25, 2013

Related U.S. Application Data

(63) Continuation of application No. PCT/JP2011/069292, filed on Aug. 26, 2011.

(30) Foreign Application Priority Data

Sep. 16, 2010   (JP) .................................. 2010-208108

(51) Int. Cl.
*H02J 7/00* (2006.01)
*B60L 11/18* (2006.01)
(Continued)

(52) U.S. Cl.
CPC .............. *H02J 7/00* (2013.01); *B60L 11/1866* (2013.01); *H01M 10/441* (2013.01);
(Continued)

(58) Field of Classification Search
CPC ............ H02J 7/0014; H02J 7/00; H02J 7/02; H02J 7/0016; H02J 7/0018; H02J 7/0019; H01M 10/46; H01M 10/44; H01M 10/441; H01M 10/482; H01M 2/1077; H01M 2010/4271; H01M 10/48; B60L 11/1866; B60L 3/00; B60L 11/18; G01R 31/362; G01R 21/3658; G01R 31/36; Y10T 10/7061; Y10T 10/7055; Y10T 10/005; Y02E 60/12
USPC ....... 320/118, 119, 134, 136, 107, 162, 109, 320/137, 108, 116; 429/223, 7, 120, 188, 429/211, 221, 94

See application file for complete search history.

(56) References Cited

U.S. PATENT DOCUMENTS 3,602,794 A * 8/1971 Westhaver .............. H02J 7/008
320/139
3,742,327 A * 6/1973 Nettles ................. G05D 3/1472
318/615

(Continued)

FOREIGN PATENT DOCUMENTS

| CN | 101026307 A | 8/2007 |
| CN | 201174408 Y | 12/2008 |

(Continued)

OTHER PUBLICATIONS ("State of Charge Determination," Electropaedia, mpoweruk, Published May 9 2008, Accessed Apr. 2 2015, http://web.archive.org/web/20080509145838/http://www.mpoweruk.com/soc.htm).*

(Continued)

*Primary Examiner* — Robert Grant
*Assistant Examiner* — John Trischler
(74) *Attorney, Agent, or Firm* — Mots Law, PLLC (57) ABSTRACT

Cell voltage equalizer includes voltage detection ICs configured to measure output voltages from cells, respectively; discharge circuits (40) provided to the respective cells, and configured to discharge the output voltages from the respective cells; and a main microcomputer (33 configured: to find a state of charge of a rechargeable battery (13) on the basis of the output voltages from the cells measured by the voltage detection ICs; to judge whether or not the state of charge is a predetermined level; to find differential values by subtracting a predetermined baseline voltage from the output voltages from the cells measured by the voltage detection ICs; and to equalize the output voltages if there exists a cell whose differential value is not less than a first voltage threshold value, by use of the corresponding discharge circuit (40).

18 Claims, 7 Drawing Sheets

(51) Int. Cl.
  *H01M 10/44* (2006.01)
  *H01M 10/48* (2006.01)
  *G01R 31/36* (2006.01)
  *H01M 2/10* (2006.01)
  *H01M 10/42* (2006.01)

(52) U.S. Cl.
  CPC ......... *H01M 10/482* (2013.01); *H02J 7/0014* (2013.01); *H02J 7/0016* (2013.01); *H02J 7/0018* (2013.01); *H02J 7/0019* (2013.01); *G01R 31/362* (2013.01); *G01R 31/3658* (2013.01); *H01M 2/1077* (2013.01); *H01M 2010/4271* (2013.01); *Y02T 10/7005* (2013.01); *Y02T 10/7055* (2013.01); *Y02T 10/7061* (2013.01)

(56) References Cited

U.S. PATENT DOCUMENTS

| | | | |
|---|---|---|---|
| 4,302,714 A * | 11/1981 | Yefsky | 320/131 |
| 4,514,694 A * | 4/1985 | Finger | G01R 31/36 324/429 |
| 5,287,286 A * | 2/1994 | Ninomiya | G01R 31/3624 320/DIG. 21 |
| 5,412,323 A * | 5/1995 | Kato | G01R 31/3648 320/152 |
| 5,504,415 A * | 4/1996 | Podrazhansky et al. | 320/118 |
| 5,557,192 A * | 9/1996 | Tamai | H02J 7/0091 320/164 |
| 5,602,481 A | 2/1997 | Fukuyama | |
| 5,670,861 A * | 9/1997 | Nor | B60L 11/185 307/10.7 |
| 5,828,201 A * | 10/1998 | Hoffman et al. | 320/104 |
| 5,889,385 A * | 3/1999 | Podrazhansky et al. | 320/130 |
| 5,895,440 A * | 4/1999 | Proctor et al. | 702/63 |
| 5,945,805 A | 8/1999 | Takei et al. | |
| 5,998,968 A * | 12/1999 | Pittman | H02J 7/0093 320/130 |
| 6,005,370 A * | 12/1999 | Gustavson | H02J 7/0052 320/137 |
| 6,040,685 A * | 3/2000 | Tsenter et al. | 320/160 |
| 6,097,172 A * | 8/2000 | Podrazhansky et al. | 320/107 |
| 6,656,640 B1 * | 12/2003 | Amiel | H01M 4/32 29/2 |
| 6,984,961 B2 * | 1/2006 | Kadouchi | H02J 7/0019 320/132 |
| 7,091,700 B2 * | 8/2006 | Kadouchi | H02J 7/0019 320/132 |
| 7,193,392 B2 * | 3/2007 | King | B60L 11/185 320/118 |
| 7,245,108 B2 * | 7/2007 | Chertok | B60L 11/185 320/132 |
| 7,378,818 B2 * | 5/2008 | Fowler | B60L 11/185 320/108 |
| 7,583,056 B2 * | 9/2009 | Chiang et al. | 320/118 |
| 7,893,652 B2 * | 2/2011 | Suzuki | B60L 11/1861 320/104 |
| 7,923,969 B2 * | 4/2011 | Murao | H02J 7/0016 307/49 |
| 7,936,149 B2 * | 5/2011 | Ohnuki | H02J 7/1423 307/36 |
| 8,054,034 B2 * | 11/2011 | Lim | H02J 7/0016 320/101 |
| 2003/0001542 A1 * | 1/2003 | Laig-Horstebrock | G01R 31/3637 320/150 |
| 2003/0146737 A1 * | 8/2003 | Kadouchi et al. | 320/132 |
| 2004/0045751 A1 * | 3/2004 | Aoki | B60L 11/1851 180/65.235 |
| 2004/0135544 A1 * | 7/2004 | King et al. | 320/116 |
| 2004/0135545 A1 * | 7/2004 | Fowler | B60L 11/185 320/118 |
| 2004/0135546 A1 * | 7/2004 | Chertok | B60L 11/185 320/118 |
| 2005/0266303 A1 * | 12/2005 | Kadouchi | H02J 7/0019 429/92 |
| 2006/0119319 A1 * | 6/2006 | Sakurai et al. | 320/116 |
| 2006/0139004 A1 | 6/2006 | Uesugi et al. | |
| 2007/0001651 A1 | 1/2007 | Harvey | |
| 2007/0025135 A1 * | 2/2007 | Yamamoto et al. | 365/132 |
| 2007/0216369 A1 * | 9/2007 | Chandler | H02J 7/0016 320/136 |
| 2007/0257642 A1 | 11/2007 | Xiao et al. | |
| 2007/0268776 A1 * | 11/2007 | Matsubara | G11C 29/006 365/233.1 |
| 2008/0053715 A1 * | 3/2008 | Suzuki | B60L 11/1861 180/2.1 |
| 2008/0084184 A1 * | 4/2008 | Ohnuki | 320/116 |
| 2008/0090133 A1 * | 4/2008 | Lim et al. | 429/50 |
| 2008/0191663 A1 * | 8/2008 | Fowler | B60L 11/185 320/118 |
| 2008/0221755 A1 * | 9/2008 | Senda | H02J 7/1438 701/36 |
| 2008/0233469 A1 * | 9/2008 | Drozdz | G01R 31/361 429/61 |
| 2009/0079391 A1 * | 3/2009 | Lupu et al. | 320/122 |
| 2009/0091297 A1 | 4/2009 | Ishikawa et al. | |
| 2009/0091332 A1 * | 4/2009 | Emori et al. | 324/537 |
| 2009/0096420 A1 * | 4/2009 | Lupu et al. | 320/122 |
| 2009/0167247 A1 * | 7/2009 | Bai et al. | 320/134 |
| 2009/0167248 A1 * | 7/2009 | Murao | H02J 7/0016 320/134 |
| 2010/0013430 A1 * | 1/2010 | Manor et al. | 320/106 |
| 2010/0014196 A1 * | 1/2010 | Oku | H02H 7/0844 361/33 |
| 2010/0039072 A1 | 2/2010 | Cegnar et al. | |
| 2010/0085009 A1 * | 4/2010 | Kang et al. | 320/118 |
| 2010/0194339 A1 * | 8/2010 | Yang et al. | 320/116 |
| 2010/0225277 A1 * | 9/2010 | Ochi | H02J 7/0016 320/132 |
| 2010/0253149 A1 * | 10/2010 | Iida | H01M 4/5825 307/77 |
| 2010/0327814 A1 * | 12/2010 | Chi | H01M 10/44 320/135 |
| 2011/0121785 A1 * | 5/2011 | Iida | H01M 10/443 320/118 |
| 2011/0285356 A1 * | 11/2011 | Maluf et al. | 320/139 |
| 2013/0085695 A1 * | 4/2013 | Ono | H01M 10/48 702/63 |
| 2013/0093430 A1 * | 4/2013 | Hagimori | G01R 31/362 324/434 |
| 2014/0197776 A1 * | 7/2014 | Schlaupitz | H02J 7/00 320/103 |

FOREIGN PATENT DOCUMENTS

| | | |
|---|---|---|
| CN | 101609994 A | 12/2009 |
| CN | 101777784 A * | 7/2010 |
| GB | 1046801 * | 10/1966 |
| GB | 2420032 A * | 5/2006 |
| JP | 2002-101565 A | 4/2002 |
| JP | 2003-189490 A | 7/2003 |
| JP | 2003-219572 A | 7/2003 |
| JP | 2004-080909 A | 3/2004 |
| JP | 2010-98866 A | 4/2010 |
| KR | 100839980 * | 6/2008 |

OTHER PUBLICATIONS

CN 101777784A, abstract, Forein Patent Retrieval Service Abstracts Database, Published Jul. 14 2010, Accessed Jun. 11 2015, online.*
Chinese office action issued on Aug. 28, 2014.
Extended European Search Report issued on Apr. 7, 2016 in the counterpart European patent application.

* cited by examiner

CELL VOLTAGE EQUALIZER FOR MULTI-CELL BATTERY PACK WHICH DETERMINES THE WAITING TIME BETWEEN EQUALIZATION OPERATIONS BASED ON THE VOLTAGE DIFFERENCE AND THE STATE OF CHARGE LEVEL

CROSS-REFERENCE TO RELATED APPLICATION

This is a Continuation of PCT Application No. PCT/JP2011/069292, filed on Aug. 26, 2011, and claims the priority of Japanese Patent Application No. 2010-208108, filed on Sep. 16, 2010, the content of both of which is incorporated herein by reference.

TECHNICAL FIELD

The present invention relates to a cell voltage equalizer for a multi-cell battery pack which includes multiple cells connected together in series and outputs a desired voltage, the cell voltage equalizer configured to equalize the output voltages from the respective cells.

BACKGROUND ART

Electric vehicles and hybrid vehicles are equipped with a high-voltage battery as a power source for driving a motor. The high-voltage battery like this obtains a high voltage by series-connecting multiple cells together in each of its rechargeable batteries (storage batteries) such as nickel-metal hydride batteries or lithium-ion batteries.

In addition, the entire rechargeable battery is charged or discharged with the same level of power. For this reason, if the level of deterioration differs in one rechargeable battery, the rechargeable battery tends to be over-charged or over-discharged. With this taken into consideration, the charged state of each cell needs to be checked in order to prevent overcharge or overdischarge of the rechargeable battery. To this end, the multiple cells (for example, 55 cells) are divided into, for example, 5 blocks (each consisting of 11 cells); and the voltage of each block is measured in real time by use of a voltage detection IC provided to the block.

Furthermore, in a case where the high-voltage battery is used for a long time while repeatedly charged and discharged, or in a case where the high-voltage battery is left unused for a long time, the state of charge varies from one rechargeable battery to another. This makes the usable capacity of the high-voltage battery diminish, and makes it no longer possible to obtain a sufficient level of electric power from the high-voltage battery. Against this background, proposals have been made on a cell voltage equalizer configured to equalize the output voltages from the respective cells, as disclosed in Japanese Patent Application Publication No. 2003-189490 (Patent Document 1) and Japanese Patent Application Publication No. 2002-101565 (Patent Document 2).

For the purpose of equalizing the output voltages from the respective cells in each of the rechargeable batteries mounted on an electric vehicle or a hybrid vehicle, the cell voltage equalizer like this detects the output voltages from the respective cells, and discharges the output voltages from cells each having a high output voltage in order to make their output voltages equal to the lowest output voltage, while the ignition is off (see Japanese Patent Application Publication

CITATION LIST

Patent Literature

Patent Document 1: Japanese Patent Application Publication No. 2003-189490
Patent Document 2: Japanese Patent Application Publication No. 2002-101565

SUMMARY OF THE INVENTION

Techinical Problem

The foregoing conventional cell voltage equalizer equalizes the output voltages from the cells on the basis of the output voltages from the cells detected by the voltage detection ICs, respectively. For this reason, values representing a baseline voltage for the equalization are likely to differ from one another depending on accuracy with which the voltage detection ICs detect the output voltages from the respective cells. This poses a problem that the output voltages from the respective cells cannot be equalized with higher accuracy.

The present invention has been made to solve the problem with the conventional art. An object of the present invention is to provide a cell voltage equalizer for a multi-cell battery pack which is capable of a the output voltages from the respective cells with high accuracy.

Solution to Problem

In order to achieve the above object, a first aspect of the present invention provides a cell voltage equalizer for a multi-cell battery pack which includes a plurality of cells connected together in series and outputs a desired voltage, the cell voltage equalizer configured to equalize output voltages from the respective cells, the cell voltage equalizer comprising: a voltage measuring device configured to measure the output voltages from the respective cells; a discharge device, provided to each of the cells, configured to discharge the output voltages from the respective cells by causing electric currents to flow between positive electrodes and negative electrodes of the cells; a state-of-charge measuring device configured to find a state of charge of the multi-cell battery pack on the basis of at least an output voltage from a cell out of the output voltages from the cells which are measured by the voltage measuring device, and judging whether or not the state of charge in an area (the area where: the output voltage is more sensitive to the change in the state of charge; and the variation in the cell voltage tends to become larger) is a predetermined level not greater than a preset first threshold value; a differential value arithmetic device configured to find differential values by subtracting a preset predetermined baseline voltage from the output voltages from the cells measured by the voltage measuring device; and an equalization controlling device configured to equalize the output voltages from the respective cells if there exists a cell whose differential value found by the differential value arithmetic device is not less than a first voltage threshold value, by making the cell discharged by the discharge device which is provided to the cell, wherein in a case where the state of charge measured by the state-of-charge measuring mean is not the predetermined level, the equalization controlling device performs the equalizing process on the cells on the condition that a preset first waiting time has passed since the previous equalizing process, and in a case where the state of charge is the predetermined level, the equalization controlling device performs the equalizing process on the cells on the condition that a second waiting time, which is shorter than the first waiting time, has passed since the previous equalizing process. If the state of charge is the predetermined level, and concurrently if the differential value of the cell of the equalizing target is not greater than the first threshold value, a length of time for equalizing the target cell may be cut shorter. Otherwise, the discharge current may be reduced.

In the above cell voltage equalizer for a multi-cell battery pack, the predetermined level may include; a case where the state of charge of the multi-cell battery pack is not greater than the first threshold value; and a case where the state of charge thereof in an area (the area where: the output voltage is more sensitive to the change in the state of charge; and the variation in the cell voltage tends to become larger) is not less than a second threshold value which is set larger than the first threshold value.

In the above cell voltage equalizer for a multi-cell battery pack, the equalization controlling device may terminate the equalizing process on the cells on the condition that all the differential values which the differential value arithmetic device finds by subtracting the baseline voltage from the output voltages from the cells are not greater than a second voltage threshold value which is set smaller than the first voltage threshold value.

Advantageous Effects of Invention

According to the first aspect of the invention, in the case where the state of charge is the predetermined level not greater than the first threshold value, the cell voltage equalizer performs the equalizing process on the cells on the condition that the second waiting time, which is shorter than the first waiting time, has passed since the previous equalizing process. For this reason, in the case where the state of charge is the predetermined level, the cell voltage equalizer performs the equalizing process again within the short length of time after the previous equalizing process. In addition, since the output voltage is more sensitive to the state of charge in the area not greater than the first threshold value, the cell voltage equalizer is capable of equalizing the output voltages from the respective cells with high accuracy.

Furthermore, since the cell voltage equalizer performs the equalizing process in the case where the state of charge is the predetermined level, the cell voltage equalizer is capable of performing the equalizing process by using the output voltages from the cells, which are detected with the high accuracy, as the baseline voltage. For this reason, values representing the baseline voltage serving as the baseline for the equalizing process are unlikely to vary depending on the accuracy with which the voltage measuring device detect the output voltages from the cells.

For this reason, it is possible to provide the cell voltage equalizer for a multi-cell battery pack, which is capable of equalizing the output voltages from the respective cells with the high accuracy.

Moreover, the cell voltage equalizer is capable of equalizing the output voltages from the respective cells with higher accuracy in the case where the predetermined level is defined as including: the case where the state of charge is not greater than the first threshold value; and the case where the state of charge is not less than the second threshold value.

Besides, in the case where the cell voltage equalizer terminates the equalizing process on the cells on the condition that all the differential values obtained by subtracting the baseline voltage from the output voltages from the respective cells are not greater than the second threshold value, the cell voltage equalizer is capable of equalizing the output voltages from the respective cells with the high accuracy while preventing the multi-cell battery pack from being over-discharged.

DESCRIPTION OF EMBODIMENTS

Descriptions will be provided hereinbelow for an embodiment of the present invention by referring to the drawings. To begin with, descriptions will be provided for a cell voltage equalizer of the embodiment of the present invention by referring to FIG. 1. The cell voltage equalizer of the embodiment of the present invention is an apparatus configured to equalize the output voltages from the respective cells in a multi-cell battery pack which includes multiple cells connected together in series, and which outputs a desired voltage.

Figure 1:
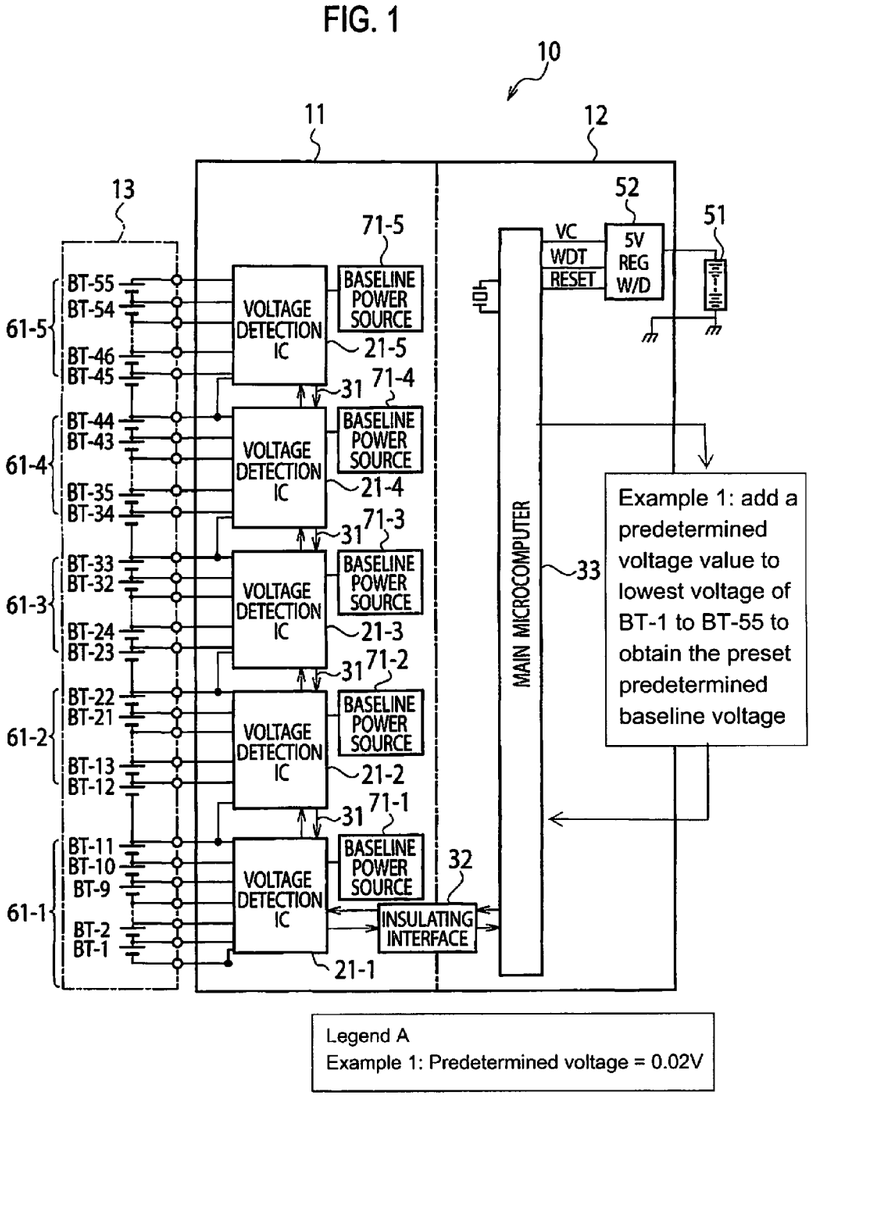
FIG. 1 is a block diagram showing a configuration of a cell voltage equalizer of an embodiment of the present invention.

FIG. 1 is a block diagram showing; the cell voltage equalizer 10 of the embodiment of the present invention: and a rechargeable battery (multi-cell battery pack) 13 which includes multiple cells BT1 to BT55. The rechargeable battery 13 of the embodiment is, for example, a lithium-ion battery or the like, which is a type of storage battery. The rechargeable battery 13 is mounted on an electric vehicle, a plug-in hybrid vehicle or the like, and is used as a high-voltage battery for driving a motor configured to drive the vehicle.

As shown in FIG. 1, the cell voltage equalizer 10 of the embodiment of the present invention is divided into a high-voltage unit 11 and a lower-voltage unit 12 with an insulating interface 32 in between.

The high-voltage unit 11 includes five voltage detection ICs (voltage detectors), namely a first voltage detection IC (21-1) to a fifth voltage detection IC (21-5). The first voltage detection IC (21-1) measures the output voltages from the respective 11 cells BT1 to BT11 defined as a first block 61-1.

In addition, the second voltage detection IC (21-2) measures the output voltages from the respective 11 cells BT12 to BT22 defined as a second block 61-2; similarly, the third voltage detection IC (21-3) measures the output voltages from the respective 11 cells BT23 to BT33 defined as a third block 61-3; the fourth voltage detection IC (21-4) measures the output voltages from the respective 11 cells BT34 to BT44 defined as a fourth block 61-4; and the fifth voltage detection IC (21-5) measures the output voltages from the respective 11 cells BT45 to BT55 defined as a fifth block 61-5. In other words, the voltage detection ICs (21-1) to (21-5) function as voltage measuring device for measuring the output voltages from the respective cells BT1 to BT55.

The voltage detection ICs (21-1) to (21-5) include discharge circuits (discharge device) 40 (see FIG. 2 and FIG. 3 which will be described later). The discharge circuits 40 are provided to the respective cells BT1 to BT55. The discharge circuits 40 discharge the output voltages from the cells BT1 to BT55 by causing currents to flow between the positive and negative electrodes of the cells BT1 to BT55, respectively. In other words, the discharge circuits 40 are provided to the respective cells BT1 to BT55, and function as the discharge device for discharging the output voltages from the cells BT1 to BT55 by causing currents to flow between the positive and negative electrodes of the cells BT1 to BT55, respectively.

In addition, the voltage detection ICs (21-1) to (21-5) include A/D converters 26 (denoted by reference sign ADC; see FIG. 2 which will be described), respectively. The voltage detection ICs (21-1) to (21-5) convert voltage signals, which are detected in the corresponding blocks (the first to fifth blocks), into digital voltage signals, respectively, by use of baseline voltages outputted from baseline power sources 71-1 to 71-5 (see FIG. 1) for the A/D converters 26 (while the ICs including their own baseline voltages use the built-in baseline voltages).

Furthermore, the second to fifth voltage detection ICs (21-2) to (21-5) are connected to the first voltage detection IC (21-1) though a communications line 31. The first voltage detection IC (21-1) is connected to a main microcomputer (state-of-charge measuring device, differential value arithmetic device, and equalizing control device) 33, which is provided in the lower-voltage unit 12, through the insulating interface 32. In other words, the main microcomputer 33 and the voltage detection ICs (21-1) to (21-5) are connected together through the insulating interface 32 in a daisy-chain communications network.

The low-voltage unit 12 is provided with a regulator 52 configured to output a 5-volt direct-current voltage. The regulator 52 generates the stable 5-volt direct-current voltage from a voltage (for example, 12 volts) which is outputted from a battery (power source) 51 mounted on the vehicle, and supplies the stable 5-volt direct-current voltage to the main microcomputer 33.

Once the main microcomputer 33 of the cell voltage equalizer 10 of the embodiment of the present invention acquires voltage detection signals by outputting a voltage detection instructing signal to the voltage detection ICs (21-1) to (21-5), the main microcomputer 33 finds a SOC (hereinafter referred to as a state of charge) of the rechargeable battery 13 on the basis of an output voltage from at least one cell (for example, an output voltage which is the lowest among the cells BT1 to BT55). Thus, the main microcomputer 33 judges whether or not the state of charge is within a range of a predetermined state (not greater than a first threshold value or not less than a second threshold value). In other words, the main microcomputer 33 functions as the state-of-charge measuring device for: acquiring the state of charge of the rechargeable battery 13 on the basis of the output voltage from at least one of the cells BT1 to BT 55 whose output voltages are measured by the voltage detection ICs (21-1) to (21-5); and judging whether or not the state of charge is within the range of the preset predetermined state.

In addition, once the main microcomputer 33 acquires the voltage detection signals by outputting the voltage detection instructing signal to the voltage detection ICs (21-1) to (21-5), the main microcomputer 33 finds differential values on the basis of the voltage detection signals by subtracting a preset baseline voltage (for example, a value obtained by adding a predetermined voltage value (for example, 0.02 V) to the lowest output voltage (for example, 3 V) from the output voltages from the cells BT1 to BT55. In other words, the main microcomputer 33 functions as the differential value arithmetic device for finding the differential values by subtracting the preset predetermined baseline voltage (for example, a value obtained by adding the predetermined voltage value (for example, 0.02 V) to the lowest output voltage (for example, 3 V) from the output voltages from the respective cells BT1 to BT55 which are measured by the voltage detection ICs (21-1) to (21-5).

Thereafter, if there exists a cell whose found differential value is not less than the first voltage threshold (for example, not less than 1.5 V), the main microcomputer 33 executes the equalizing process of equalizing the output voltages from the respective cells BT1 to BT55 by making the discharge circuit 40 (see FIG. 2 and FIG. 3), which are provided to the particular cell, discharge the particular cell. In other words, if there exists a cell whose found differential value is not less than the first voltage threshold value, the main microcomputer 33 functions as the equalizing control device for equalizing the output voltages from the respective cells BT1 to BT55 by making the discharge circuit 40, which is provided to the particular cell, discharge the particular cell. The process of equalizing the cells BT1 to BT55 is terminated on the condition that all the differential values are not greater than the second voltage threshold value (for example, 0.5 V).

Moreover, if the found state of charge is out of the range of the predetermined state, the main microcomputer 33 executes the process of equalizing the cells BT1 to BT55 on the condition that a preset first waiting time (for example, one hour) has passed since the previous equalizing process.

On the other hand, if the found state of charge is within the range of the predetermined state, the main microcomputer 33 executes the process of equalizing the cells BT1 to BT55 on the condition that a second waiting time (for example, 30 minutes), which is shorter than the first waiting time (for example, one hour), has passed since the previous equalizing process. This process will be described in detail later.

Figure 2:
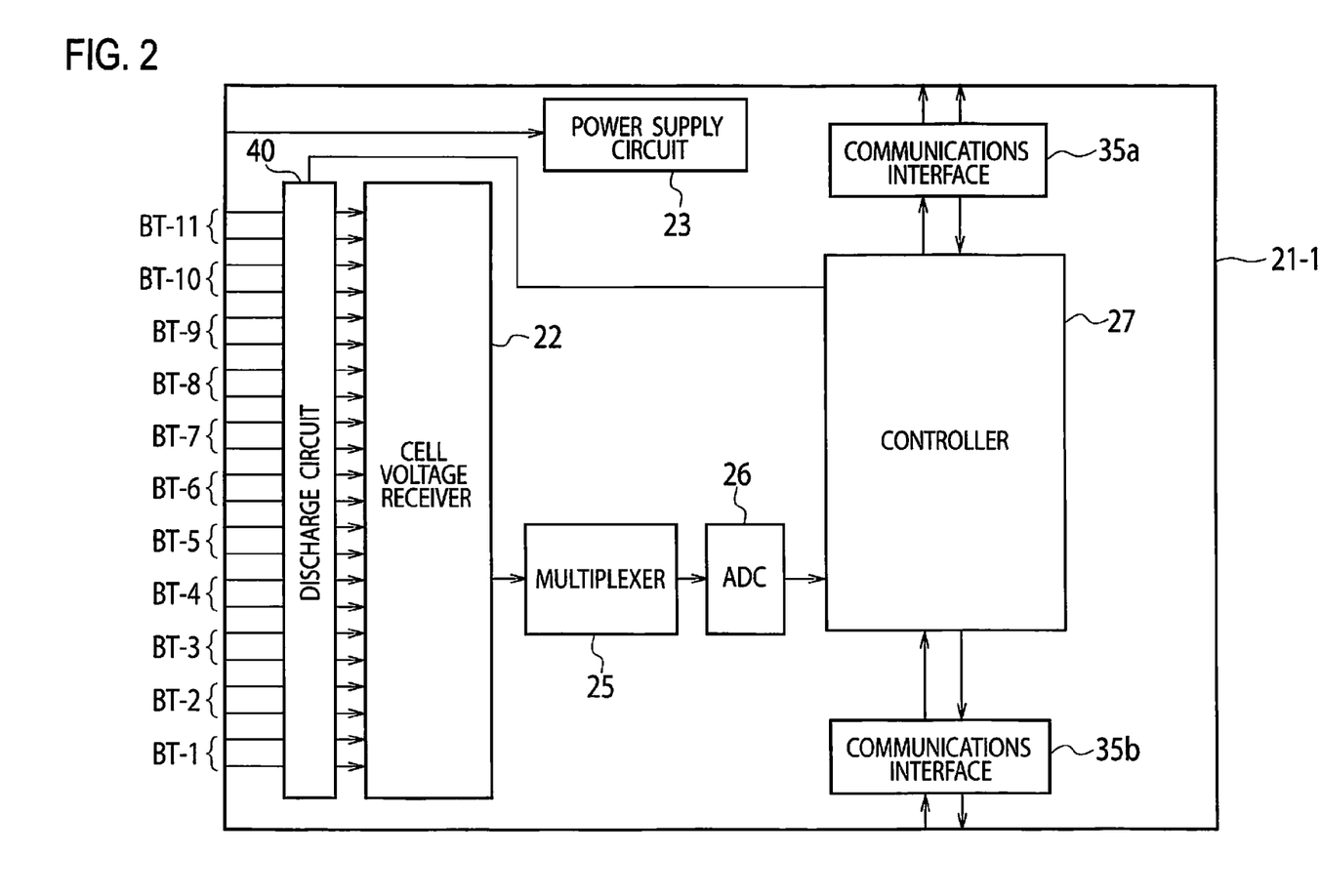
FIG. 2 is a block diagram showing a detailed configuration of the cell voltage equalizer of the embodiment of the present invention.

Next, descriptions will be provided for a detailed configuration of the voltage detection ICs of the embodiment of the present invention by referring to FIG. 2. FIG. 2 is a block diagram showing an internal configuration of the first voltage detection IC (21-1) of the embodiment of the present invention. It should be noted that because the second to fifth voltage detection ICs (21-2) to (21-5) have almost the same configuration as the first voltage detection IC (21-1), detailed descriptions for the second to fifth voltage detection ICs (21-2) to (21-5) will be omitted.

As shown in FIG. 2, the first voltage detection IC 21-1 includes: the discharge circuits 40 provided to the respective cells BT1 to BT11; a power supply circuit 23 configured to receive the electric powers outputted from the respective cells BT1 to BT11, and to generate a predetermined voltage; a cell voltage receiver 22 connected to the cells BT1 to BT11 provided to the block 61-1 through the discharge circuits 40, and configured to detect the output voltages from the cells; a multiplexer 25 configured to convert the voltage signals of the respective cells, which are outputted from the cell voltage receiver 22, into one time-series signal; and an A/D converter 26 configured to convert the voltage signals of the respective cells, which are outputted from the multiplexer 25, into digitals signals.

The A/D converter 26 converts the analog signals to the corresponding digital signals by use of a baseline voltage outputted from the baseline power source 71-1 (see FIG. 1). In addition, the first voltage detection IC 21-1 includes a controller 27 and two communications interfaces 35a, 35b (instead, the first voltage detection IC 21-1 may the communications interface 35a alone).

The controller 27 controls the first voltage detection IC (21-1) overall. Particularly in a case where the cell voltage detection instructing signal is sent by the main microcomputer 33 shown FIG. 1, the controller 27 sends the output voltages from the cells BT1 to BT11, which are detected by the cell voltage receiver 22, to the main microcomputer 33 through the communications interfaces 35a, 35b.

In addition, in a case where a cell discharge start instructing signal is sent by the main microcomputer 33 shown in FIG. 1, the controller 27 starts to make an output voltage from a cell, to which the discharge start instruction is applied, discharged by the corresponding discharge circuit 40. In a case where a cell discharge termination instructing signal is sent by the main microcomputer 33, the controller 27 terminates the discharge by the discharge circuit 40.

Figure 3:
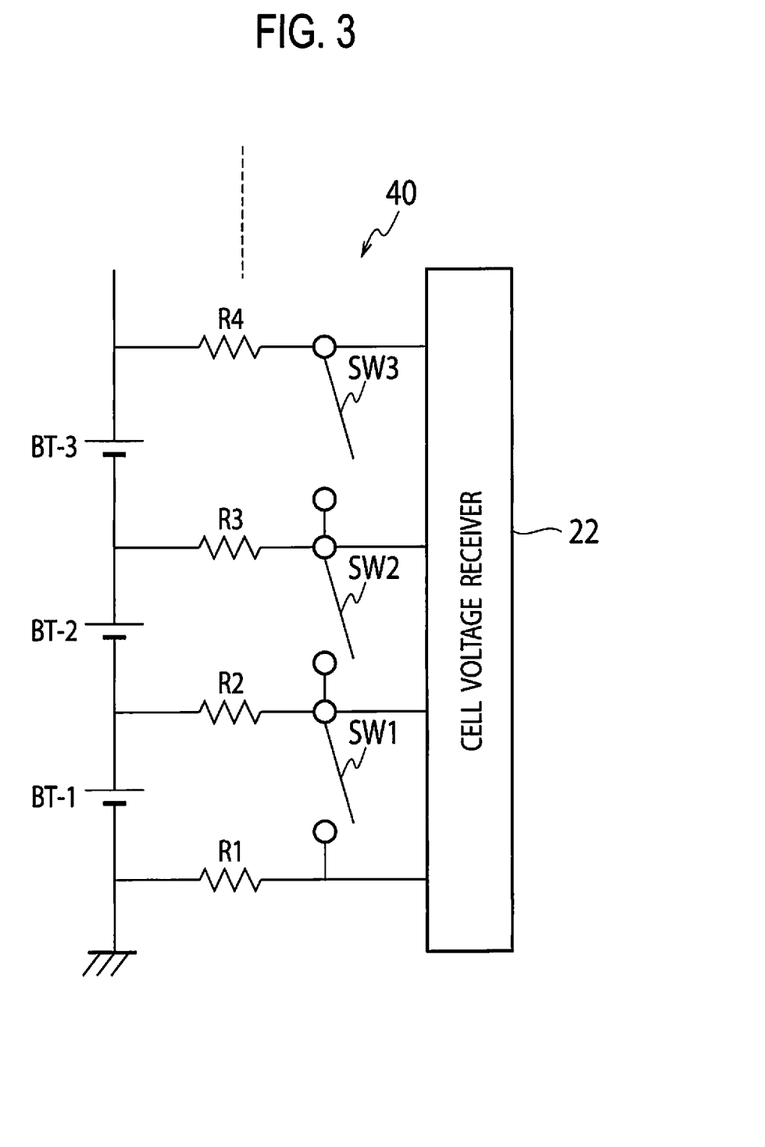
FIG. 3 is a diagram showing discharge circuits of the cell voltage equalizer of the embodiment of the present invention.

Next, descriptions will be provided for the discharge circuits of the embodiment of the present invention by referring to FIG. 3. FIG. 3 is a circuit diagram of the discharge circuits provided to the cells BT1 to BT3 of the embodiment of the present invention. Incidentally, detailed descriptions for the cell BT4 to BT 55 will be omitted because the cells BT4 to BT55 have the same circuit configuration as the cells BT1 to BT3.

As shown in FIG. 3, the discharge circuits 40 are provided to the respective cells BT1 to BT3, and discharge the output voltages from the cells by causing currents to flow between the positive and negative electrodes of the cells BT1 to BT3. The discharge circuits 40 includes switches (a switch SW1 to a switch SW3) and resistors R (a resistor R1 to a resistor R4), respectively. Thus, on the basis of the discharge start instructing signal or the discharge termination instructing signal sent by the main microcomputer 33 shown FIG. 1, the discharge circuits 40 control the discharge of the output voltages from the cells BT1 to the BT3 by controlling the ON and OFF of the switches SW (the switch SW1 to the switch SW3).

For example, in a case where the discharge start instructing signal for the cell BT1 is sent by the main microcomputer 33 shown in FIG. 1, the controller 27 (see FIG. 2) starts to discharge the output voltage from the cell BT1 by turning on the switch SW1 provided to the cell BT1.

Once the main microcomputer 33 starts the discharge, the main microcomputer 33 measure a length of time during which the cell BT1 continues being discharged by use of a timer (whose illustration is omitted). When a predetermined length of time (for example, three minutes) has passed since the start of the discharge, the main microcomputer 33 sends the discharge termination instructing signal of the cell BT1, and the controller 27 accordingly terminates the discharge of the output voltage from the cell BT1 by turning off the switch SW1 provided to the cell BT1.

Figure 4:
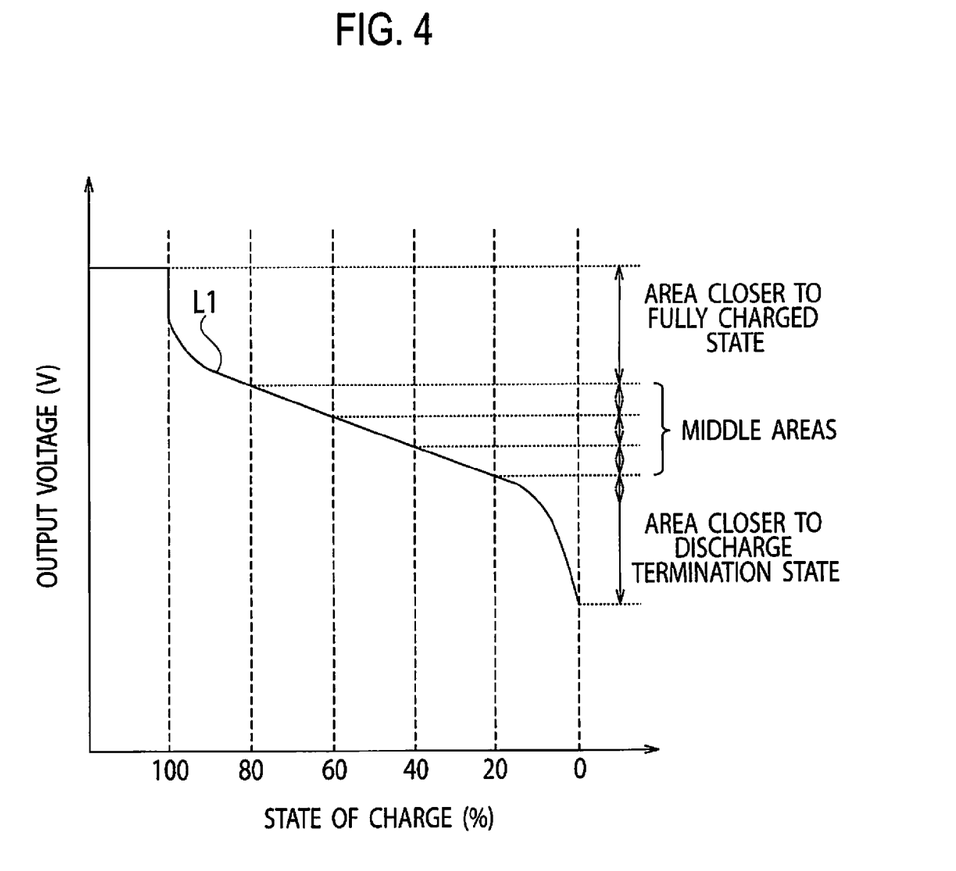
FIG. 4 is a characteristic diagram showing a relationship between a state of charge and an output voltage in a rechargeable battery of the embodiment of the present invention.
Figure 5:
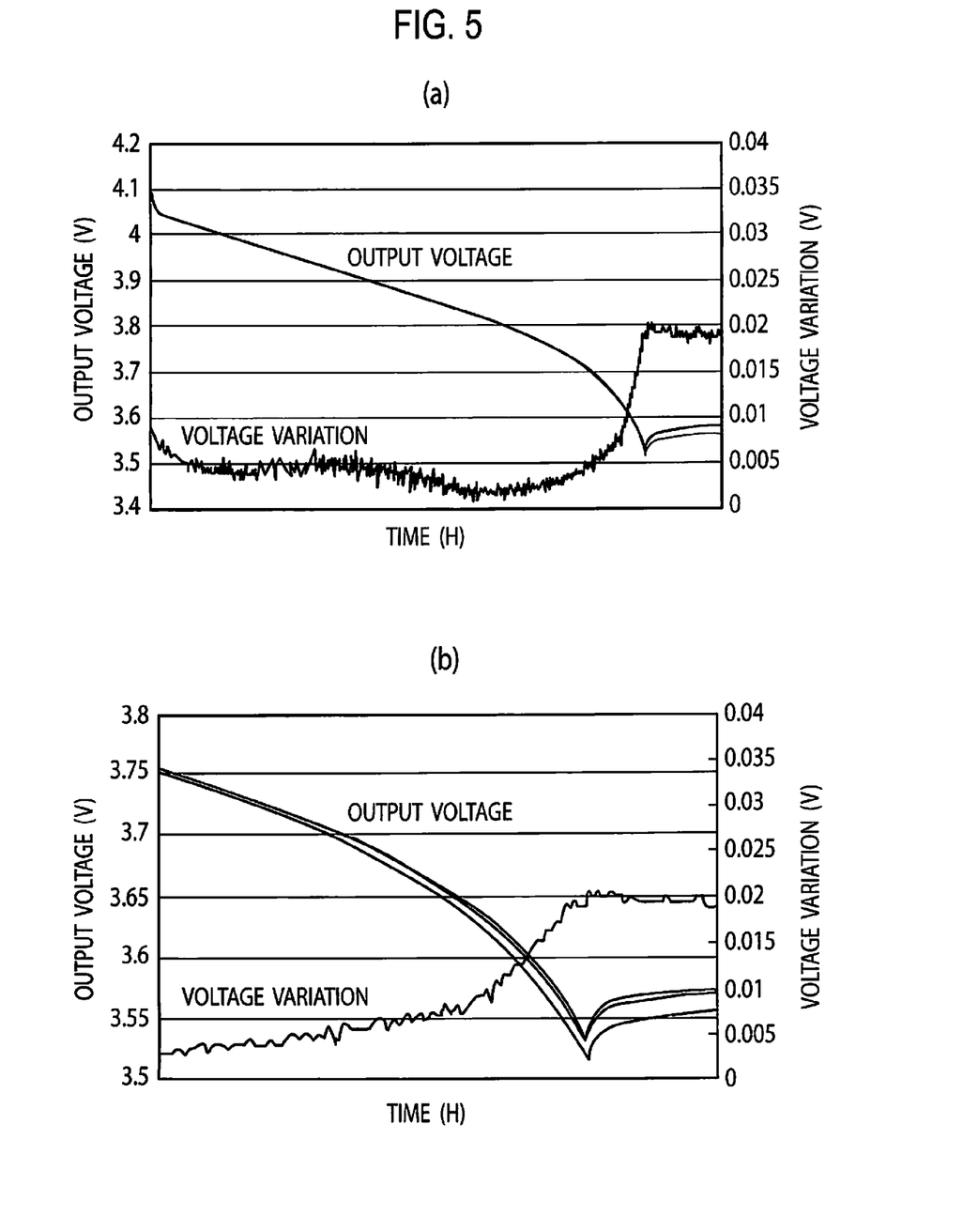
FIG. 5 is characteristic diagrams each showing a relationship among an output voltage, a voltage variation and a lapse of time, which is observed when the output voltage is discharged from a cell of the embodiment of the present invention.
Figure 6:
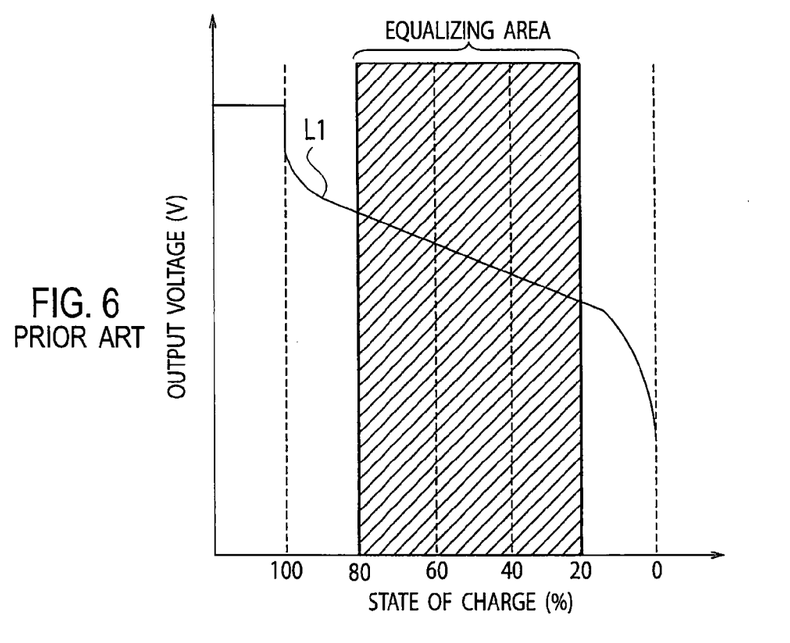
FIG. 6 is a diagram showing a conventional equalizing area.
Figure 7:
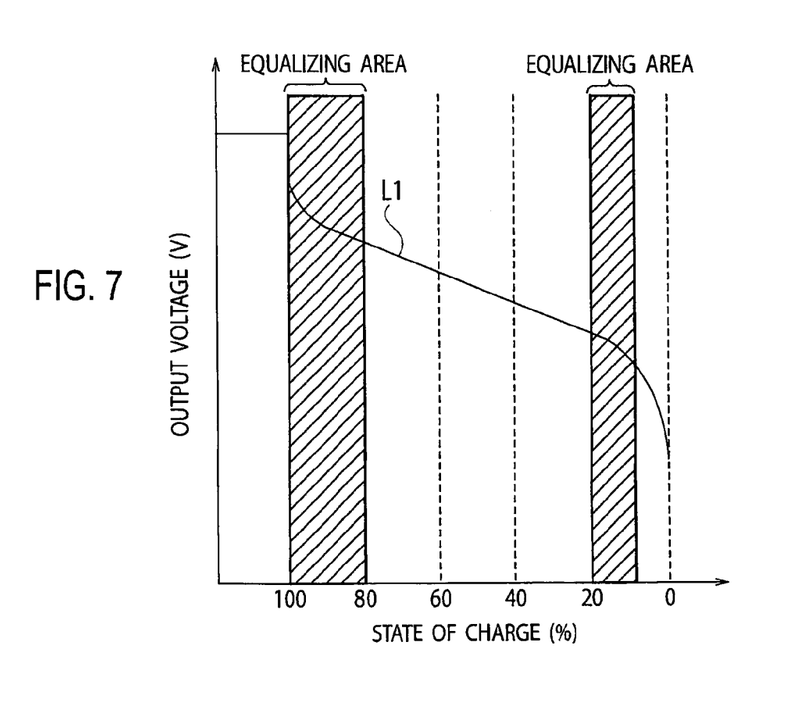
FIG. 7 is a diagram showing equalizing areas of the cell voltage equalizer of the embodiment of the present invention.

Next, descriptions will be provided for the state of charge of the rechargeable battery of the embodiment of the present invention. FIG. 4 is a characteristic diagram showing a relationship between the state of charge and the output voltage of the rechargeable battery of the embodiment of the present invention. FIG. 5(a) is a characteristic diagram showing a relationship among the output voltage, a voltage variation and a lapse of time, which is observed when the output voltages are discharged from the cells of the embodiment of the present invention. FIG. 5(b) is a magnified diagram showing the level of a voltage close to the discharge termination, which is shown in FIG. 5(a), in a magnified manner. FIG. 6 is a diagram showing a conventional equalizing area. FIG. 7 is a diagram showing equalizing areas of the cell voltage equalizer of the embodiment of the present invention.

As shown in FIG. 4, when the rechargeable battery 13 becomes closer to a fully charged state in which electric charges are fully accumulated in the rechargeable battery 13, or when the rechargeable battery 13 becomes closer to a discharge termination state in which the rechargeable battery 13 loses the accumulated electrical charges, the output voltage from the rechargeable battery 13 changes to a large extent even though the state of charge of the rechargeable battery 13 changes slightly. This is because the output voltage becomes more sensitive to the change in the state of charge (SOC).

To put it specifically, the output voltage changes more sensitively in response to the change in the state of charge in an area where the state of charge (for example, an actually usable portion of the battery which is measured on a continuum between 100% meaning a fully charged state and 0% meaning a completely discharged state) is not greater than 20% (the first threshold), and in an area where the state of charge is not less than 80% (the second threshold). For this reason, the inclination of a curve L1 representing the relationship between the state of charge and the output voltage becomes larger (i.e., the rate of the change in the output voltage to the state of charge becomes larger) in an area closer to the fully charged state, and in an area closer to the discharge termination state.

On the other hand, the output voltage does not sensitively change in response to the change in the state of charge in a middle area in the state of charge which is not less than 20% but not greater than 80%. For this reason, the inclination of the curve L1 representing the relationship between the state of charge and the output voltage becomes smaller and constant in the middle area in the state of charge. In other words, the curve Li representing the relationship between the state of charge and the output voltage becomes linear in the middle area (see the middle area in FIG. 4).

As shown in FIG. 5 (a) and FIG. 5 (b), once the cells BT1 to BT 55 of the rechargeable battery 13 are discharged (FIG. 5(a) and FIG. 5(b) are diagrams showing a case where 7 cells are discharged), the voltage variation (differences in the output voltage among the cells BT1 to BT55, and a difference between the highest output voltage and the lowest output voltage) becomes larger. In a case where the voltage variation is larger, the rechargeable battery 13 is more likely to be over-charged or over-discharged.

A conventional practice is that the rechargeable battery used in a high-voltage batter mounted on a hybrid vehicle and configured to drive a motor for driving the vehicle is used while the state of charge is in the middle area (see FIG. 4), as shown in FIG. 6. For this reason, the rechargeable battery performs the equalizing process only while the state of charge is in the middle area (an equalizing area shown in FIG. 6). For this reason, the rechargeable battery is incapable of performing the equalizing process while the rechargeable process is closer to the fully charged state and the discharge termination state where the output voltage becomes more sensitive to the change in the state of charge, particularly closer to the discharge termination state where the voltage variation becomes larger. This requires higher accuracy with which the cell voltages are detected.

To put it specifically, the equalizing process is carried out by equalizing the output voltages from the respective cells BT1 to BT 55 on the basis of the output voltages from the respective cells BT1 to BT55, which are detected by the voltage detection ICs (21-1) to (21-5). This makes the values used for the baseline voltage for the equalizing likely to differ from one another in the middle area (see FIG. 4) where the output voltage does not sensitively change in response to the change in the state of charge, depending on accuracy with which the voltage detection ICs (21-1) to (21-5) detect the output voltages from the respective cells BT1 to BT55.

Particularly the electric vehicle, the hybrid vehicle and the like are capable of using the rechargeable battery not only in the middle area (see FIG. 4) but also in the areas closer to the fully-charged state and the discharge termination state (see FIG. 4). This widens the area in which the rechargeable battery is used.

With this taken into consideration, the cell voltage equalizer 10 of the embodiment of the present invention equalizes the output voltages from the respective cells BT1 to BT55 with higher accuracy by carrying out the equalizing process in the areas closer to the fully charged state and the discharge termination state where the output voltage is more sensitive to the change in the state of charge, particularly in the area closer to the discharge termination state where the voltage variation becomes larger.

In other words, as shown in FIG. 7, the cell voltage equalizer 10 performs the equalizing process, too, in the area where: the output voltage is more sensitive to the change in the state of charge; the voltage variation is larger; and the state of charge is not greater than 20% (the first threshold value) (an equalizing area shown in FIG. 7), and in the area where: the output voltage is more sensitive to the change in the state of charge; and the state of charge is not less than 80% (the second threshold value) (the other equalizing area shown in FIG. 7).

In addition, the cell voltage equalizer 10 of the embodiment of the present invention performs the equalizing process on the cells BT1 to BT55 within the range of the equalizing area shown in FIG. 6, on the condition that the first waiting time (for example, one hour) has passed since the previous equalizing process.

Furthermore, the cell voltage equalizer 10 of the embodiment of the present invention performs the equalizing process on the cells BT1 to BT55 within the ranges of the equalizing areas shown in FIG. 7, on the condition that the second waiting time (for example, 30 minutes), which is shorter than the first waiting time, has passed since the previous equalizing process.

As described above, the output voltage is more sensitive to the state of charge within the ranges of the equalizing areas shown in FIG. 7, that is to say, the area where the state of charge is not greater than 20% (the first threshold), and the area where the state of charge is not less than 80% (the second threshold). In addition, the voltage variation is larger within the range of the area where the state of charged is not greater than 20% (the first threshold) . For these reasons, the repetition of the equalizing process in short intervals makes it possible to equalize the output voltages from the respective cells BT1 to BT55 with higher accuracy.

The equalizing process can be performed using the accurately detected output voltages from the respective cells BT1 to BT55 as the baseline voltages when performed in the case where the state of charge is in the area not greater than the first threshold value (for example, 20%) (i.e., the area where: the output voltage is more sensitive to the change in the state of charge; and the voltage variation is larger), or in the area not less than the second threshold (80%) (i.e., the area where the output voltage is more sensitive to the change in the state of charge). For this reason, the values used as the baseline voltage (for example, the value obtained by adding the predetermined voltage value (for example, 0.02 V) to the lowest output voltage (for example, 3 V)) representing the baseline for the equalizing process are unlike to differ from one another depending on the accuracy with which the voltage detection ICs (21-1) to (21-5) detect the output voltages from the respective cells BT1 to BT55.

This makes it possible to provide the cell voltage equalizer 10 for the rechargeable battery 13 which is capable of equalizing the output voltages from the respective cells BT1 to BT55 with higher accuracy.

Figure 8:
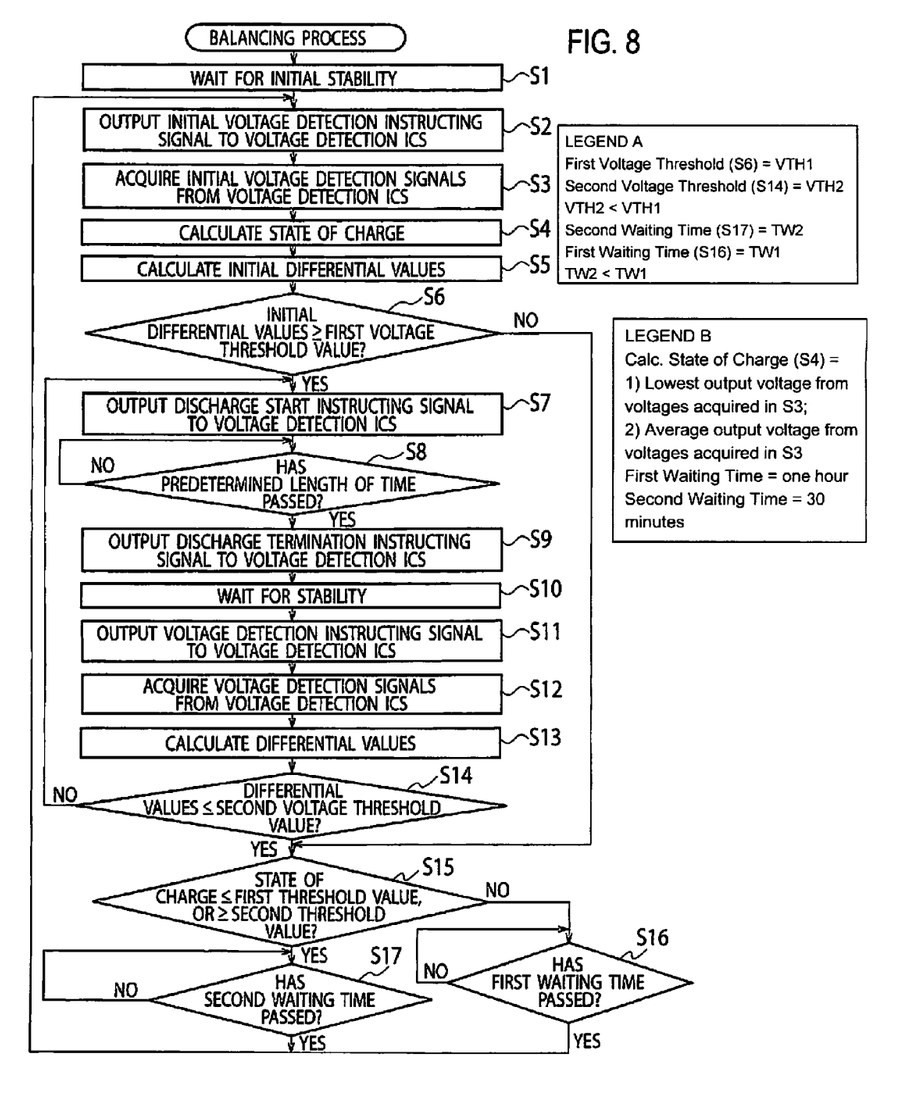
FIG. 8 is a flowchart showing the equalizing process carried out by the cell voltage equalizer of the embodiment of the present invention.

Next, descriptions will be provided for how the thus-configured cell voltage equalizer 10 of the embodiment of the present invention works. FIG. 8 is a flowchart showing the equalizing process of the cell voltage equalizer of the embodiment of the present invention.

First of all, the main microcomputer 33 halts its operation for a certain length of time until the output voltages from the respective cells BT1 to BT55 of the rechargeable battery 13 become stable (step S1).

Subsequently, the main microcomputer 33 outputs an initial voltage detection instructing signal to the voltage detection ICs (21-1) to (21-5) (step S2). The voltage detection ICs (21-1) to (21-5) instructed by the main microcomputer 33 detect the output voltages from the respective cells BT1 to BT55 in the blocks, and send the detected voltage signals of the respective cells BT1 to BT55 to the main microcomputer 33 through the communications interfaces 35a, 35b.

Thereafter, the main microcomputer 33 acquires the initial voltage detection signals from the voltage detection ICs (21-1) to (21-5) (step S3).

Afterward, the main microcomputer 33 calculates the state of charge (step S4). The state of charge is calculated on the basis of the voltage detection signals acquired in step S3. To put it specifically, the state of charge of the rechargeable battery 13 (for example, the actually usable portion of the battery which is measured on the continuum between 100% meaning the fully charged state and 0% meaning the completely discharged state) is calculated on the basis of an output voltage which the lowest among the output voltages of the respective cells BT1 to BT55.

Next, the main microcomputer 33 calculates initial differential values (step S5). The initial differential values are calculated on the basis of the voltage detection signals acquired in step S3. To put it specifically, the baseline voltage (for example, 3 V+0.02 V=3.02 V) is set by adding the predetermined voltage value (for example, 0.02 V) to the output value (for example, 3 V) which is the lowest among the output voltages from the respective cells BT1 to BT55; and the differential values are obtained by subtracting the baseline voltage from the output voltage of the cells BT1 to BT55.

Since as described above, the baseline voltage is set by adding the predetermined voltage value to the lowest voltage value, it is possible to prevent the output voltages from the respective cells BT1 to BT55 from becoming an output voltage value which is lower than the lowest voltage value, that is to say, it is possible to prevent the rechargeable battery 13 from being over-discharged.

Next, the main microcomputer 33 judges whether or not the initial differential values are not less than the first voltage threshold value (step S6). In other words, the main microcomputer 33 judges whether or not there exists a cell whose initial differential value calculated in step S5 is not less than the first voltage threshold value (for example, 1.5 V).

If the main microcomputer 33 judges that there exists no cell whose initial differential value is not less than the first voltage threshold value (step S6: NO), the main microcomputer 33 moves to the process in step S15. In other words, the main microcomputer 33 judges that the voltage variation (the differences in the output voltage among the cells BT1 to BT55, and the difference between the highest output voltage and the lowest output voltage) is smaller, and does not perform a discharge process (a process from step S7 through step S14) for making the discharge circuits 40 discharge the output voltages from the cells (BT1 to BT55).

On the other hand, if the main microcomputer 33 judges that there exists a cell whose initial differential value is not less than the first voltage threshold value (step S6: YES), the main microcomputer 33 outputs the discharge start instructing signal to the voltage detection ICs (21-1) to (21-5) (step 57). In other words, if there exists a cell whose initial differential value calculated in step S5 is not less than the first voltage threshold value (for example, 1.5 V), the main microcomputer 33 judges that the variation in the output voltages from the respective cells BT1 to BT55 is larger (the differences in the output voltage among the cells BT1 to BT55 are larger, and the difference between the highest output voltage and the lowest output voltage is larger), and outputs a signal for turning on the switch SW (see FIG. 3) of the discharge circuit 40 provided to the cell whose initial differential value is not less than the first voltage threshold value.

The voltage detection ICs (21-1) to (21-5) instructed by the main microcomputer 33 turn on the switch SW (see FIG. 3) of the discharge circuit 40 provided to the cell, which is instructed to start the discharge, and start to discharge the output voltage from the cell.

Subsequently, the main microcomputer 33 judges whether or not the predetermined length of time has passed (step S8). If the main microcomputer 33 judges that the predetermined length of time has not passed yet (step S8: NO), the main microcomputer 33 waits until the predetermined length of time has passed.

On the other hand, if the main microcomputer 33 judges that the predetermined length of time has passed (step S8: YES), the main microcomputer 33 outputs the discharge termination instructing signal to the voltage detection ICs (21-1) to (21-5) (step S9). In other words, the main microcomputer 33 measures the length of time for which the output voltage is discharge from the cell by use of the timer (whose illustration is omitted). Then, when a predetermined length of time (for example, three minutes) has passed since the start of the discharge, the main microcomputer sends the discharge termination instructing signal.

The voltage detection ICs (21-1) to (21-5) instructed by the main microcomputer 33 terminate the discharge of the output voltage from the cell by turning off the switch SW (see FIG. 3) of the discharge circuit 40 provided to the cell which is in the process of being discharged.

Thereafter, the main microcomputer 33 halts its operation for a certain length of time until the output voltages from the respective cells BT1 to BT55 of the rechargeable battery 13 become stable (step S10).

Afterward, the main microcomputer 33 outputs the voltage detection instructing signal to the voltage detection ICs (21-1) to (21-5) (step S11). The voltage detection ICs (21-1) to (21-5) instructed by the main microcomputer 33 detect the output voltages from the respective cells BT1 to BT55 in the blocks, and send the detected voltage signals of the respective cells BT1 to BT55 to the main microcomputer 33 through the communications interfaces 35a, 35b.

Next, the main microcomputer 33 acquires the voltage detection signals from the voltage detection ICs (21-1) to (21-5) (step 12).

Then, the main microcomputer 33 calculates differential values (step S13). The differential values are calculated on the basis of the voltage detection signals acquired in step S12. To put it specifically, the baseline voltage (for example, 3 V+0.02 V=3.02 V) is set by adding the predetermined voltage value (for example, 0.02 V) to the output value (for example, 3 V) which is the lowest among the output voltages of the respective cells BT1 to BT55; and the differential values are obtained by subtracting the baseline voltage from the output voltage of the cells BT1 to BT55.

Subsequently, the main microcomputer 33 judges whether or not the differential values are not greater than the second voltage threshold value (step S14). In other words, the main microcomputer 33 judges whether or not all the differential values calculated in step S12 are not greater than the second voltage threshold value (for example, 0.5 V) which is set less than the first voltage threshold value (for example, 1.5 V) (i.e., the main microcomputer 33 judges whether or not all differential values obtained by subtracting the baseline voltage from the cells BT1 to BT55 are not greater than the second threshold value).

If the main microcomputer 33 judges that all the differential values are greater than the specific threshold value (step S14: No), the main microcomputer 33 returns to the process in step S7. In other words, the main microcomputer 33 repeats the discharge process (the process from step S7 through step S14) for making the discharge circuit 40 discharge the output voltages from the cells (BT1 to BT55) until all the differential values become not greater than the second voltage threshold value (the main microcomputer 33 repeats the discharge using the discharge circuits 40 provided to the cells whose differential values are not less than the second voltage threshold value).

On the other hand, if the main microcomputer 33 judges in the process in step S6 that there exists no cell whose differential value is not less than the first voltage threshold value (step S6: NO) , or if the main microcomputer 33 judges in the process in step S14 that all the differential values are not greater than the second voltage threshold value (step S14: YES), the main microcomputer 33 judges whether the state of charge is not greater than the first threshold value or not less than the second threshold value (step S15). In other words, the main microcomputer 33 judges whether the state of charge of the rechargeable battery 13 calculated in step S4 is in the area (see FIG. 7) in which: the output voltage is more sensitive to the change in the state of charge; the voltage variation is larger; and the state of charge is not greater than the first threshold value (for example, 20%), or in the area (see FIG. 7) in which: the output voltage is more sensitive to the change in the state of charge; and the state of charge is not less than the second threshold value (for example, 80%).

The main microcomputer 33 judges whether the state of charge is not greater than the first threshold value or not less than the second threshold value: by having values beyond which the inclination of the curve L1 representing the relationship between the state of charge and the output voltage changes (values beyond which the rate of the change in the output voltage to the state of change becomes larger, see FIG. 4) stored as the threshold values (i.e., the first threshold value and the second threshold value) in a memory (whose illustration is omitted) in advance on the basis of the characteristic of the rechargeable battery 13; and on the basis of the threshold values (i.e., the first threshold value and the second threshold value) beyond which the rate of the change in the output voltage to the state of charge becomes larger.

If the main microcomputer 33 judges that the state of charge is greater than the first threshold value or less than the second threshold value (step S15: NO), the main microcomputer 33 judges whether or not the first waiting time has passed (step S16). In other words, in a case that the state of charge is not in the area closer to the fully charged state or in the area closer to the discharge termination state, where the output voltage is more sensitive to the change in the state of charge, the main microcomputer 33 judges whether or not the first waiting time (for example, one hour) has passed.

If the main microcomputer 33 judges that the first waiting time has not passed yet (step S16: NO), the main microcomputer 33 waits until the first waiting time has passed.

If the main microcomputer 33 judges that the first waiting time has passed (step S16: YES), the main microcomputer 33 returns to the process in step S2. In other words, the main microcomputer 33 performs the equalizing process on the cells BT1 to BT55 on the condition that the first waiting time has passed since the previous equalizing process (the process from step S2 through step S14).

On the other hand, if the main microcomputer 33 judges that the state of charge is not greater than the first threshold value or not less than the second threshold value (step S15: YES), the main microcomputer 33 judges whether the second waiting time has passed (step S17). In other words, in a case where the state of charge is in the area closer to the fully charged state or in the area closer to the discharge termination state, where the output voltage is more sensitive to the change in the state of charge, the main microcomputer 33 judges whether or not the second waiting time which is shorter than the first waiting time has passed.

If the main microcomputer 33 judges that the second waiting time has not passed yet (step S17: NO), the main microcomputer 33 waits until the second waiting time has passed.

If the main microcomputer 33 judges that the second waiting time has passed (step S17: YES), the main microcomputer 33 returns to the process in step S2. In other words, the main microcomputer 33 performs the equalizing process on the cells BT1 to BT55 on the condition that the second waiting time which is shorter than the first waiting time has passed since the previous equalizing process (the process from step S2 through step S14).

As described above, the cell voltage equalizer 10 of the embodiment of the present invention is the cell voltage equalizer 10 for the rechargeable battery 13 which includes the multiple cells BT1 to BT55 connected together in series and outputs the desired voltage, the cell voltage equalizer 10 configured to equalize the output voltages from the respective cells BT1 to BT55. The cell voltage equalizer 10 includes: the voltage detection ICs (21-1) to (21-5) configured to measure the output voltages from the respective cells BT1 to BT55; the discharge circuits 40 provided to the respective cells BT1 to BT55, and configured to discharge the output voltages from the respective cells BT1 to BT55 by causing currents to flow between the positive electrodes and the negative electrodes of the cells BT1 to BT55; and the main microcomputer 33. The main microcomputer 33 is configured: to find the state of charge of the rechargeable battery 13 on the basis of at least an output voltage from a cell (for example, an output voltage value which is the lowest among the cells BT1 to BT55) out of the output voltages from the cells which are measured by the voltage detection ICs (21-1) to (21-5); to judge whether or not the state of charge is a predetermined level not greater than the preset first threshold value (for example, 20%); to find differential values by subtracting the preset predetermined baseline voltage (for example, the value obtained by adding the predetermined voltage value (for example, 0.02 V) to the lowest output voltage (for example, 3 V)) from output voltages from the cells BT1 to BT55 which are measured by the voltage detection ICs (21-1) to (21-5); and to equalize the output voltages from the cells BT1 to BT55 if there exists a cell whose found differential value is not less than the first voltage threshold value (for example, 1.5 V), by making the cell discharged by the discharge circuit 40 which is provided to the cell. In addition, in a case where the state of charge is not the predetermined level, the main microcomputer 33 performs the equalizing process on the cells BT1 to BT55 on the condition that the preset first waiting time (for example, one hour) has passed since the previous equalizing process. In a case where the state of charge is the predetermined level, the main microcomputer 33 performs the equalizing process on the cells BT1 to BT55 on the condition that the second waiting time (for example, 30 minutes), which is shorter than the first waiting time, has passed since the previous equalizing process.

In addition, the cell voltage equalizer 10 of the embodiment of the present invention defines the predetermined level as including: the case where the state of charge of the rechargeable battery 13 is not greater than the first threshold value (for example, 20%); and a case where the state of charge thereof is not less than the second threshold value (for example, 80%) which is set larger than the first threshold value.

Furthermore, in the cell voltage equalizer 10 of the embodiment of the present invention, the main microcomputer 33 terminates the equalizing process on the cells BT1 to BT55 on the condition that all the differential values obtained by subtracting the baseline voltage (for example, the value obtained by adding the predetermined voltage value (for example, 0.02 V) to the lowest output voltage (for example, 3 V)) from the output voltages from the respective cells BT1 to BT55 are not greater than the second voltage threshold value (for example, 0.5 V) which is set smaller than the first voltage threshold value (for example, 1.5 V).

Moreover, the cell voltage equalizer 10 of the embodiment of the present invention performs the equalizing process in the case where the state of charge of the rechargeable battery 13 is in the area not greater than the first threshold value (for example, 20%) (the area where: the output voltage is more sensitive to the change in the state of charge; and the variation in the cell voltage tends to become larger). For this reason, the cell voltage equalizer 10 is capable of equalizing the output voltages from the cells with higher accuracy.

Besides, in the case where the state of charge of the rechargeable battery 13 is in the area where the state of charge is not greater than the first threshold value (for example, 20%) (the area where: the output voltage is more sensitive to the change in the state of charge; and the voltage variation is larger), the cell voltage equalizer 10 performs the equalizing process on the cells BT1 to BT55 on the condition that the second waiting time (for example, 30 minutes), which is shorter than the first waiting time (for example, one hour), has passed since the previous equalizing process (the process from step S2 through step S14). Accordingly, in a case where the state of charge of the rechargeable battery 13 is that which allows the highly accurate equalizing process, the cell voltage equalizer 10 performs the equalizing process again within the short length of time after the previous equalizing process. For this reason, the cell voltage equalizer 10 is capable of equalizing the output voltages from the respective cells BT1 to BT55 with higher accuracy.

In addition, since the cell voltage equalizer 10 performs the equalizing process (the process from step S2 through step S14) in the case where the state of charge of the rechargeable battery 13 is in the area where the state of charge is not greater than the first threshold value (for example, 20%) (the area where: the output voltage is more sensitive to the change in the state of charge; and the voltage variation is larger), the cell voltage equalizer 10 is capable of performing the equalizing process by using the output voltages from the cells BT1 to BT55, which are detected with the higher accuracy, as the baseline voltage. For this reason, the baseline voltage (for example, the value obtained by adding the predetermined voltage value (for example, 0.02 V) to the lowest output voltage (for example, 3 V)) serving as the baseline for the equalizing process is unlikely to vary depending on the accuracy with which the voltage detection ICs (21-1) to (21-5) detect the output voltages from the cells BT1 to BT55.

Accordingly, it is possible to provide the cell voltage equalizer 10 for the rechargeable battery 13, which is capable of equalizing the output voltages from the respective cells BT1 to BT55 with the higher accuracy.

In addition, the cell voltage equalizer 10 performs the equalizing process (the process from step 2 through step 14) with the predetermined level defined as including: the case where the state of charge of the rechargeable battery 13 is in the area (see FIG. 7) where the output voltage is more sensitive to the change in the state of charge, the voltage value is large, and the state of charge is not greater than the first threshold value (for example, 20%); and the case (see FIG. 7) where the output voltage is more sensitive to the change in the state of charge, and the state of charge is not less than the second threshold value (for example, 80%). For this reason, the cell voltage equalizer 10 is capable of equalizing the output voltages from the respective cells BT1 to BT55 with the higher accuracy.

Furthermore, since the cell voltage equalizer 10 performs the equalizing process in the area (see FIG. 7) where the output voltage is more sensitive to the change in the state of charge, the voltage variation is larger, and the state of charge is not greater than the first threshold value, or in the area (see FIG. 7) where the output voltage is more sensitive to the change in the state of charge, and the state of charge is not less than the second threshold value, the cell voltage equalizer 10 is capable of equalizing the output voltages from the cells BT1 to BT55 with the higher accuracy without using highly-accurate voltage detection ICs. Moreover, since no highly-accurate voltage detection IC is necessary, the cell voltage equalizer 10 is capable of reducing costs which would otherwise be incurred for a voltage monitoring system.

Besides, the cell voltage equalizer 10 terminates the equalizing process on the cells BT1 to BT55 on the condition that all the differential values obtained by subtracting the baseline voltage (for example, the value obtained by adding the predetermined voltage value (for example, 0.02 V) to the lowest output voltage (for example, 3 V)) from the output voltages from the respective cells BT1 to BT55 are not greater than the second voltage threshold value (for example, 0.5 V). For this reason, the cell voltage equalizer 10 is capable of equalizing the output voltages from the respective cells BT1 to BT55 with the higher accuracy while preventing the rechargeable battery 13 from being overdischarged.

Additionally, the cell voltage equalizer 10 does not cause a problem that: highly-accurate voltage detection ICs are used for the purpose of improving the accuracy with which the output voltages are detected from the respective cells; and the manufacturing costs accordingly increases because of an increase in the number of component parts, and because of the addition of a step of managing the component parts. Thus, the cell voltage equalizer 10 decreases component parts in number and reduces the weight compared to a case where highly-accurate voltage detection ICs are in use.

What is more, since the cell voltage equalizer 10 performs the equalizing process in the area (see FIG. 7) where: the output voltage is more sensitive to the change in the state of charge; the voltage variation is larger; and the state of charge is not greater than the first threshold value, or in the area (see FIG. 7) where: the output voltage is more sensitive to the change in the state of charge; and the state of charge is not less than the second threshold value, the cell voltage equalizer 10 is capable of performing the highly efficient equalizing process. For this reason, the cell voltage equalizer 10 reduces the power consumption, and is accordingly capable of using the electric power effectively while reducing unnecessary charge.

Although the foregoing descriptions have been provided for the cell voltage equalizer for the rechargeable battery of the present invention on the basis of the illustrated embodiment, the present invention is not limited to this embodiment. The constitution of each part may be replaced with an arbitrary constitution which has the same function.

For example, the foregoing embodiment has been described citing the case where the state of charge of the rechargeable battery 13 is calculated on the basis of the lowest output voltage. The present invention, however, is not limited to this case . The state of charge thereof may be calculated on the basis of the average of the output voltages, or on the basis of a specific cell.

In addition, the foregoing embodiment has been described citing the case where the baseline voltage is set at the value (for example, 3.02 V) obtained by adding the predetermined voltage value (for example, 0.02 V) to the lowest output voltage (for example, 3 V) among the output voltages from the cells BT1 to BT55. However, the present invention is not limited to this case. The baseline voltage may be a value representing the lowest output voltage value among the output voltages from the cells BT1 to BT55 (to which no predetermined voltage value is added), or an average of the output values of the cells BT1 to BT55.

Furthermore, the foregoing embodiment has been described citing the case where once the discharge starts, the main microcomputer 33 measures the length of time of the discharge by use of the timer. The present invention, however, is not limited to this case. A configuration may be employed in which the controller 27 measures the length of time of the discharge by the timer or the like, and turns off the switch of the corresponding discharge circuit 40 after a predetermined length of time has passed.

INDUSTRIAL APPLICABILITY

The present invention is extremely useful in providing the cell voltage equalizer for the multi-cell battery pack, which is capable of equalizing the output voltages of the respective cells with high accuracy.

The invention claimed is:

1. A cell voltage equalizer for a multi-cell battery pack which includes a plurality of cells connected together in series and outputs a desired voltage, the cell voltage equalizer configured to equalize output voltages from the respective cells, the cell voltage equalizer comprising:
 a voltage measuring device configured to measure the output voltages from the respective cells;
 a discharge device, provided to each of the cells, configured to discharge the output voltages from the respective cells by causing electric currents to flow between positive electrodes and negative electrodes of the cells;
 a state-of-charge measuring device configured to find a state of charge of the multi-cell battery pack on the basis of at least an output voltage from a cell out of the output voltages from the cells which are measured by the voltage measuring device, and judging whether or not the state of charge is a predetermined level not greater than a preset first threshold value;
 a differential value arithmetic device configured to find differential values by subtracting a preset predetermined baseline voltage from the output voltages from each of the respective cells measured by the voltage measuring device; and
 an equalization controlling device configured to equalize the output voltages from the respective cells if there exists a cell whose differential value found by the differential value arithmetic device is not less than a first voltage threshold value, by making the cell discharged by the discharge device which is provided to the cell, wherein
  in a case where the state of charge measured by the state-of-charge measuring device is not the predetermined level, the equalization controlling device performs the equalizing process on the cells on the condition that a preset first waiting time has passed since the previous equalizing process,
  in a case where the state of charge is the predetermined level, the equalization controlling device performs the equalizing process on the cells on the condition that a second waiting time, which is shorter than the first waiting time, has passed since the previous equalizing process; and
  the equalization controlling device terminates the equalizing process on the cells on the condition that all the differential values which the differential value arithmetic device finds by subtracting the baseline voltage from the output voltages from the cells are not greater than a second voltage threshold value which is set smaller than the first voltage threshold value.

2. The cell voltage equalizer for a multi-cell battery pack of claim 1, wherein the predetermined level includes; a case where the state of charge of the multi-cell battery pack is not greater than the first threshold value; and a case where the state of charge thereof is not less than a second threshold value which is set larger than the first threshold value.

3. The cell voltage equalizer for a multi-cell battery pack of claim 2, wherein the preset predetermined baseline voltage is obtained by adding a predetermined voltage value to a lowest one of the measured output voltage from the respective cells.

4. The cell voltage equalizer for a multi-cell battery pack of claim 1, wherein the preset predetermined baseline voltage is obtained by adding a predetermined voltage value to a lowest one of the measured output voltage from the respective cells.

5. The cell voltage equalizer for a multi-cell battery pack of claim 4, wherein the predetermined voltage value is 0.02V.

6. The cell voltage equalizer for a multi-cell battery pack of claim 4, wherein the predetermined voltage value is set to prevent the rechargeable battery from being over-discharged.

7. The cell voltage equalizer for a multi-cell battery pack of claim 1, further comprising A/D converters to convert the output voltages from the respective cells into digital voltage signals, respectively, using baseline voltages outputted from baseline power sources for the A/D converters.

8. The cell voltage equalizer for a multi-cell battery pack of claim 1, wherein the discharge device provided to each of the cells includes respective switches and resistors.

9. The cell voltage equalizer for a multi-cell battery pack of claim 8, wherein
 the discharge device controls the discharge of the output voltages from the respective cells by controlling the ON and OFF conditions of the switches on the basis of a discharge start instructing signal or a discharge termination instructing signal.

10. The cell voltage equalizer for a multi-cell battery pack of claim 9, wherein
 in response to the discharge start instructing signal for a first one of the respective cells is received, the output voltage from the first one of the respective cells is discharged by turning on a first one of the switches provided to the first one of the respective cells until the discharge termination instructing signal is received after a predetermined length of time has passed since the discharge start instructing signal is received and the first one of the switches is turned off.

11. The cell voltage equalizer for a multi-cell battery pack of claim 1, wherein the equalization controlling device equalizes the output voltages from the respective cells in the equalizing process in conditions wherein
 the output voltages are more sensitive to the change in the state of charge and the state of charge is not greater than 20%, and
 the output voltages are more sensitive to the change in the state of charge and the state of charge is not less than 80%.

12. The cell voltage equalizer for a multi-cell battery pack of claim 1, wherein the first preset waiting time is one hour and wherein the second waiting time is 30 minutes.

13. The cell voltage equalizer for a multi-cell battery pack of claim 1, wherein the state-of-charge measuring device finds the state of charge of the multi-cell battery pack based on at least a lowest output voltage from a cell out of the output voltages from the cells, which are measured by the voltage measuring device.

14. The cell voltage equalizer for a multi-cell battery pack of claim 1, wherein the state-of-charge measuring device finds the state of charge of the multi-cell battery pack based on an average output voltage from the output voltages from the cells which are measured by the voltage measuring device.

15. The cell voltage equalizer for a multi-cell battery pack of claim 1, wherein the equalization controlling device starts a discharge process on the cells on the condition that all the differential values which the differential value arithmetic device finds by subtracting the baseline voltage from the output voltages from the cells are not less than the first voltage threshold value.

16. The cell voltage equalizer for a multi-cell battery pack of claim 15, wherein the equalization controlling device terminates a discharge process on the cells on the condition that a predetermined length of time has passed.

17. The cell voltage equalizer for a multi-cell battery pack of claim 16, wherein
the discharge device provided to each of the cells includes respective switches and resistors,
the discharge device turns on ones of the respective switches on the bases of a discharge start instructing signal received from the equalization controlling device, and
the discharge device turns off ones of the respective switches on the basis of a discharge termination instructing signal received from the equalization controlling device.

18. The cell voltage equalizer for a multi-cell battery pack of claim 15, wherein after a halt in operation for a certain length of time until the output voltages from the respective cells become stable the equalization controlling device repeats a discharge process until a condition that all the differential values which the differential value arithmetic device finds by subtracting the baseline voltage from the output voltages from the cells are not less than the first voltage threshold value.

* * * * *